United States Patent
Zhao et al.

(10) Patent No.: US 11,886,313 B2
(45) Date of Patent: Jan. 30, 2024

(54) TEMPERATURE ASSISTED NAND FLASH MANAGEMENT

(71) Applicant: Innogrit Technologies Co., Ltd., Shanghai (CN)

(72) Inventors: Gang Zhao, Chandler, AZ (US); Lin Chen, Cupertino, CA (US); Wei Jiang, Fremont, CA (US); Jie Chen, Milpitas, CA (US); Tao Wei, Shanghai (CN)

(73) Assignee: Innogrit Technologies Co., Ltd., Shanghai (CN)

( * ) Notice: Subject to any disclaimer, the term of this patent is extended or adjusted under 35 U.S.C. 154(b) by 560 days.

(21) Appl. No.: 17/026,603

(22) Filed: Sep. 21, 2020

(65) Prior Publication Data
US 2022/0091954 A1   Mar. 24, 2022

(51) Int. Cl.
| | | |
|---|---|---|
| *G06F 11/30* | (2006.01) | |
| *G06F 11/07* | (2006.01) | |
| *G11C 7/04* | (2006.01) | |
| *G11C 7/14* | (2006.01) | |
| *G11C 16/10* | (2006.01) | |
| *G11C 16/26* | (2006.01) | |
| *G11C 16/34* | (2006.01) | |

(52) U.S. Cl.
CPC ........ *G06F 11/3037* (2013.01); *G06F 11/076* (2013.01); *G06F 11/3058* (2013.01); *G11C 7/04* (2013.01); *G11C 7/14* (2013.01); *G11C 16/10* (2013.01); *G11C 16/26* (2013.01); *G11C 16/3404* (2013.01); *G11C 16/349* (2013.01)

(58) Field of Classification Search
CPC ............... G06F 11/3037; G06F 11/076; G06F 11/3058; G06F 11/3034; G11C 7/04; G11C 7/14; G11C 29/021; G11C 29/028
See application file for complete search history.

(56) References Cited

U.S. PATENT DOCUMENTS

2018/0293029 A1*  10/2018  Achtenberg ......... G11C 29/028

OTHER PUBLICATIONS

Luo et al., 2018 IEEE International Symposium on High Performance Computer Architecture (HPCA) (pp. 504-517 (Year: 2018).*

\* cited by examiner

*Primary Examiner* — Cynthia Britt
*Assistant Examiner* — Rong Tang
(74) *Attorney, Agent, or Firm* — IPro, PLLC

(57) ABSTRACT

Systems, apparatus and methods are provided for temperature assisted non-volatile storage device management in a non-volatile storage system. In one embodiment, a non-volatile storage system may comprise a temperature sensor, a non-volatile storage device and a processor. The processor may be configured to obtain a read-out from the temperature sensor, generate a predicted real-time on-die temperature for the non-volatile storage device based on the read-out, generate an estimated threshold voltage for reading data stored in the non-volatile storage device based on the predicted real-time on-die temperature and conduct a local sweep of a reference voltage using the estimated threshold voltage as a starting point to obtain a final read reference voltage with a minimum read bit error rate.

20 Claims, 2 Drawing Sheets

TEMPERATURE ASSISTED NAND FLASH MANAGEMENT

TECHNICAL FIELD

The disclosure herein relates to the NAND flash device management and implementation, particularly relates to temperature assisted NAND flash device management.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use NAND flash devices to achieve data storage. The NAND flash devices are a family of integrated circuits that are manufactured by advanced process and assembly technologies to achieve multiple levels of vertical stacking of storages units into a small footprint of die and package for high capacity of storage.

The storage capacity of SSDs has been increased with new NAND flash process technology breakthroughs, such as multi-level cell (MLC) and triple-level cell (TLC). The new technology breakthroughs, however, also introduce new challenges of increased bit error rate and reduced device lifetime due to the reduced threshold voltage intervals. The electrical charge level representing each storage state is usually in a Gaussian statistical distribution with a mean and a variance, in which the boundaries between adjacent distributions represents the optimal levels of read reference voltage where a minimum read bit error rate can be achieved.

The NAND device lifetime and reliability have also demonstrated great dependency on the temperature. On one hand, the retention error increases with higher temperature. On the other hand, the threshold voltage increases with higher programming temperature, which helps reduce the bit error rate and improves reliability.

Most existing NAND flash devices include a temperature sensor. The sensor output can be read out by a storage controller with a latency of approximately hundreds of micro-seconds. This feature was originally designed to prevent overheating and it is not very efficient to perform a NAND temperature sensor read-out by the controller because the data bus usage will be limited during the read-out period, leading to a longer latency and reduced bandwidth for regular program and read operations.

Without a timely and accurate reading of the NAND temperature, when the controller is aware of a potential threshold voltage shift due to temperature change, the SSD controller usually adopts a brute force read retry approach by incrementally sweeping the reference voltage until finding the optimal voltage level at lowest bit error rate. This approach is simple but often time consuming because the voltage sweep could typically take 5 to 20 read retry iterations. In addition, when the threshold voltage change is more significant, the incremental voltage sweep can be in a wrong direction and fail to converge to a solution.

In modern SSD, there is a need in the art for a solution to set and optimize the NAND reference voltages with the real-time temperature.

SUMMARY

The present disclosure provides a temperature-assisted hardware technique to actively monitor and model the NAND device temperature without sacrificing the NAND data bus bandwidth. In an exemplary embodiment, there is provided a method that may comprise obtaining a read-out from a temperature sensor in a non-volatile storage system, generating a predicted real-time on-die temperature for a non-volatile storage device in the storage system based on the read-out, generating an estimated threshold voltage for reading data stored in the non-volatile storage device based on the predicted real-time on-die temperature and conducting a local sweep of a reference voltage using the estimated threshold voltage as a starting point to obtain a final read reference voltage with a minimum read bit error rate.

In another exemplary embodiment, there is provided a non-volatile storage system. The non-volatile storage system may comprise a non-volatile storage device, a temperature sensor and a processor. The processor may be configured to obtain a read-out from the temperature sensor, generate a predicted real-time on-die temperature for the non-volatile storage device based on the read-out, generate an estimated threshold voltage for reading data stored in the non-volatile storage device based on the predicted real-time on-die temperature, and conduct a local sweep of a reference voltage using the estimated threshold voltage as a starting point to obtain a final read reference voltage with a minimum read bit error rate.

In yet another exemplary embodiment, there is provided a non-transitory machine-readable medium. The non-transitory machine-readable medium may have computer instructions that when executed by a hardware processor, may cause the hardware processor to perform obtaining a read-out from a temperature sensor in a non-volatile storage system, generating a predicted real-time on-die temperature for a non-volatile storage device in the storage system based on the read-out, generating an estimated threshold voltage for reading data stored in the non-volatile storage device based on the predicted real-time on-die temperature and conducting a local sweep of a reference voltage using the estimated threshold voltage as a starting point to obtain a final read reference voltage with a minimum read bit error rate.

DETAILED DESCRIPTION

Figure 1A:
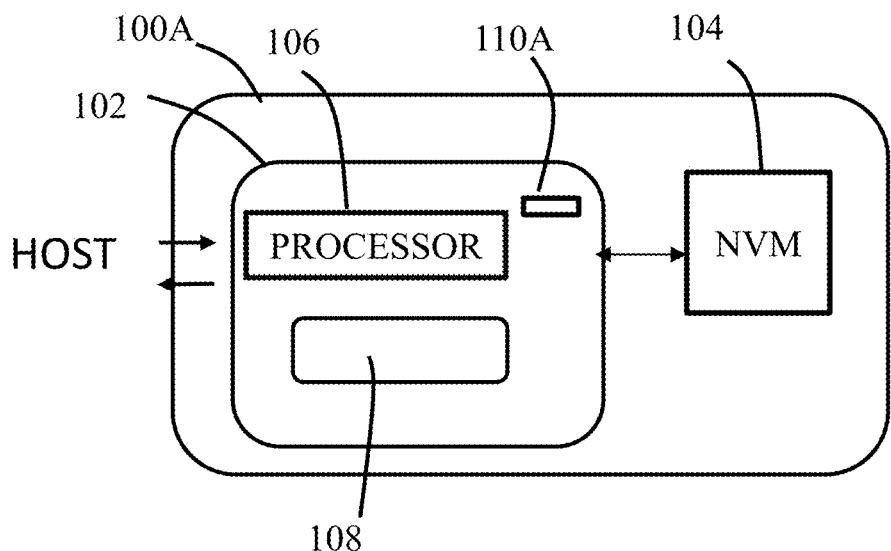
FIG. 1A schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for a temperature-assisted hardware technique to actively monitor and model the non-volatile storage device temperature without sacrificing the non-volatile storage data bus bandwidth. As used herein, a non-volatile memory device may be a computer storage device that can maintain stored information after being powered off, and the stored information may be retrieved after being power cycled (turned off and back on). Non-volatile storage devices may include NAND flash memories, NOR flash memories, magnetoresistive random Access Memory (MRAM), resistive random access memory (RRAM), phase change random access memory (PCRAM), Nano-RAM, etc. In the description, a NAND flash may be used as an example to demonstrate the controller implemented electrical mirroring techniques. However, various embodiments according to the present disclosure may implement the techniques with other types of non-volatile storage devices.

FIG. 1 schematically shows a non-volatile storage system 100A in accordance with an embodiment of the present disclosure. The non-volatile storage system 100A may comprise a non-volatile storage controller 102 and a non-volatile storage device 104. The non-volatile storage system 100A may provide data storage and/or access to stored data to a host when it is coupled to the host. The one non-volatile storage device 104 may be a non-volatile memory (NVM), for example, a NAND device. It should be noted that the non-volatile storage system 100A may comprise a plurality of non-volatile storage devices and the non-volatile storage device 104 may be shown as a representative for the plurality of non-volatile storage devices.

The non-volatile storage controller 102 may comprise a processor 106, a non-transitory computer-readable storage media 108 and a temperature sensor 110A. The processor 106 may be a computer processor, such as, but not limited to, a microprocessor or a microcontroller. The temperature sensor 110A may provide read-outs for temperatures. The reference threshold voltage for obtaining data stored on the non-volatile storage device 104 may be affected by the real-time on-die temperature. The on-die temperature may refer to the temperature on the non-volatile storage device 104.

In some embodiments, a thermal model may be built to predict the real-time on-die temperature based on a read-out from the temperature sensor 110A. That is, the read-outs from the temperature sensor 110A may be used to obtain predicted real-time on-die temperatures for the one non-volatile storage device 104.

In an embodiment, a multivariable temperature regression model may be developed to model the non-volatile storage device on-die temperature as the temperature sensor's read-out with a correction (e.g., $T_{read-out}$+Correction). For example, the temperature sensor 110A's read-out at a latest time stamp may be used as the initial temperature value $T_{read-out}$ to be corrected. The temperature correction may depend on a variety of factors including the temperature sensor readings, the physical distance from the temperature sensor 110A to the non-volatile storage device 104, the thermal properties of heat conducting materials in the system, the access frequencies and read/write access intensity (the number of access over a fixed time interval) for the non-volatile storage device 104. These factors may be various variables in the regression model. The respective coefficients for each variable and mathematical relationships (e.g., linear, polynomial, log, etc.) for each variable may be obtained by accurately fitting simulation results to measurement data (e.g., least squares, least absolute deviations regression, etc.). For example, in a controlled setting (e.g., a lab or experiment), the actual real-time on-die temperature may be monitored using temperature sensors and the actual real-time on-die temperature may be used to fit the regression model.

In some embodiment, the temperature regression model may be stored as computer instructions in the non-transitory computer-readable storage media 108 and, during operation of the system 100A, may be executed by the processor 106 to obtain a predicted real-time on-die temperature for the non-volatile storage device 104 based on a read-out from temperature sensor 110A.

With a real-time predicted temperature for the non-volatile storage device 104, an estimated threshold voltage may be obtained. In some embodiments, a multivariable voltage regression model may be used to obtain the estimated threshold voltage. The estimated threshold voltage may be modeled as an initial reference voltage V0 with a voltage correction ΔV. The initial reference voltage V0 may be the threshold voltage immediately after a cell in the non-volatile storage device 104 is programmed. During programming, a higher programming temperature may increase the median of each charge state, thus also increase the reference voltage that may have a minimum read bit error rate. In an embodiment, the initial reference voltage may be obtained based on an on-die temperature right after the cell is programmed and the number of Program/Erase (P/E) cycles for the cell. For example, an empirical model may be built to estimate the initial reference voltage based on the on-die temperature right after the cell is programmed and the number of P/E cycles for the cell. The voltage correction may depend on a variety of factors, including the predicted real-time on-die temperature, the self-recovery impact, the data retention time, and the number of P/E cycles. These factors may be various variables in the voltage regression model.

In one embodiment, the storage controller 102 may keep a time stamp every time a storage block in the non-volatile storage device 104 is programmed; thus, a dwell time may be calculated as the time period between two consecutive program access. An average dwell time may be obtained across multiple P/E cycles after a predetermined number of P/E cycles. The factor self-recovery impact may be represented in the multivariable regression model by the average dwell time. In general, the average dwell time obtained from more recent P/E cycles may have more effective self-recovery impact than earlier P/E cycles. For example, the average dwell time used for the multivariable regression model may be obtained across the last 20 to 50 P/E cycles, or the last 10% of P/E cycles (e.g., from 20 to up to several hundred P/E cycles). For each storage block of the non-volatile storage device 104, the storage controller 102 may keep a record of the P/E cycle count. For the data retention time, the time stamp of programming a storage block of the non-volatile storage device 104 may be used. The data retention time may be obtained as the time difference between a read access and the last program access. The reference voltage may also increase with the increase of dwell time, thanks to the self-recovery impact. The long dwell time helps increase the lifetime of the NAND device. In general, the longer the dwell time, the slower the retention loss and the slower the change of reference voltage.

In some embodiments, the estimated threshold voltage may be lower than the initial reference voltage $V_0$ with the increase of data retention time. That is, the adjustment ΔV may be a negative value, and the absolute value of the adjustment is bigger when the data retention time is longer. Moreover, in one embodiment, a higher predicted real-time on-die temperature may cause the reference voltage to go lower faster and the voltage regression model to generate a lower estimated threshold voltage. In some embodiments, the increase of the dwell time, however, may cause the reference voltage to increase and the voltage regression model to generate a higher estimated threshold voltage. This may be caused by the self-recovery impact. Furthermore, a higher programming temperature will increase the median of each charge state, thus may also increase the optimal reference voltage and cause the voltage regression model to generate a higher estimated threshold voltage. These effects of the various factors on the estimated threshold voltage may be examples and the regression fitting process may generate the corresponding coefficients for these effects to be reflected in the generated estimated threshold voltage.

In some embodiment, the voltage regression model may also be stored as computer instructions in the non-transitory computer-readable storage media 108 and, during operation of the system 100A, may be executed by the processor 106 to obtain an estimated reference voltage for the non-volatile storage device 104.

With the estimated threshold voltage, the processor 106 may be configured to perform a local sweep process to find a final reference voltage that has a minimum read bit error. In some embodiments, the processor 106 may use the estimated reference voltage generated by the regression model as the starting point of to conduct a local sweep of a reference voltage. In one embodiment, the processor 106 may be configured to adjust the reference voltage from the estimated reference voltage. In performing the local sweep, the processor 106 may be configured to control the storage controller 102 to adjust the read reference voltage without blindly conducting the incremental sweep of the reference voltage. For example, the processor 106 may be configured to control the storage controller 102 to send commands to the non-volatile storage device 104 to direct the non-volatile storage device 104 to use the adjusted reference voltages to read from the non-volatile storage device 104. The controller may conduct a read or read retry operation with the reference voltage adjusted by each voltage step. Based on the data received from the non-volatile storage device 104, the bit error rate or error count may be calculated for every read and the processor 102 may determine a final read reference voltage with a minimum read bit error. The final read reference voltage may be a new optimal reference voltage because this reference voltage may have the minimum bit error rate. An embodiment using this approach not only eliminates the lengthy voltage sweep iterations in conventional approach, but also prevents the controller 102 from being trapped in a wrong result due to significant threshold voltage change.

In some embodiment, the local sweep process may also be stored as computer instructions in the non-transitory computer-readable storage media 108 and, during operation of the system 100A, may be executed by the processor 106 to perform the local sweep. The processor 106 may control the controller 102 to send commands to the non-volatile storage device 104 to read data from the non-volatile storage device 104 using locally adjusted reference voltages.

Figure 1B:
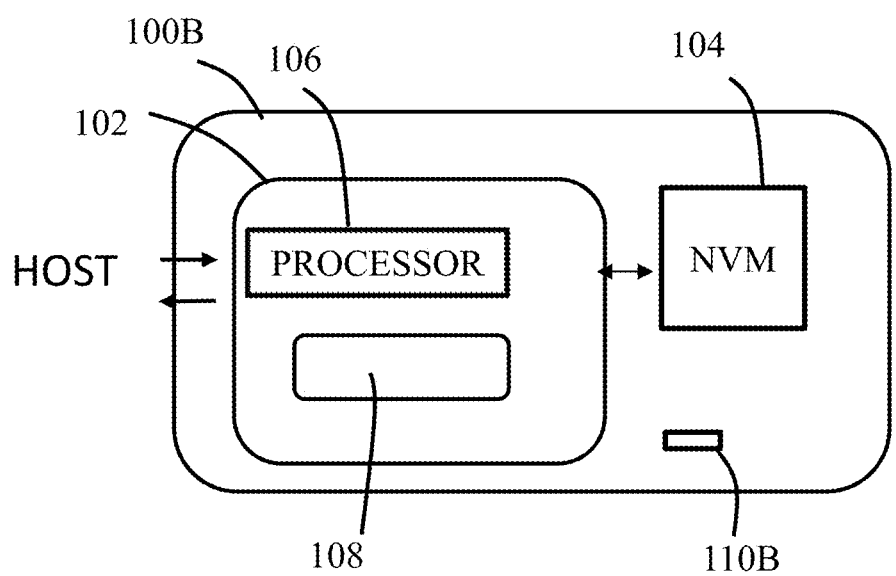
FIG. 1B schematically shows a non-volatile storage system in accordance with another embodiment of the present disclosure.

FIG. 1B schematically shows a non-volatile storage system 100B in accordance with another embodiment of the present disclosure. In the embodiment shown in FIG. 1B, the system 100B may comprise a temperature sensor 110B on a printed circuit board (PCB) that hosts the storage controller 102 and the non-volatile storage device 104. Other than the location of the temperature sensor 110B being different from the location of the temperature sensor 110A, other components of the system 100B may be identical to their respective counterparts of the system 100A. Similar to the temperature sensor 110A, the read-outs from the temperature sensor 110B may be used to obtain the predicted real-time on-die temperature for the non-volatile storage device 104. It should be noted that the temperature regression model developed using the temperature sensor 110B may contain the same set of variables and may be built the same way as using the read-outs from the temperature sensor 110A. But some coefficients for some variables (e.g., factors) may be different. The voltage regression model and local sweep process may be the same as that of the system 100A.

Figure 1C:
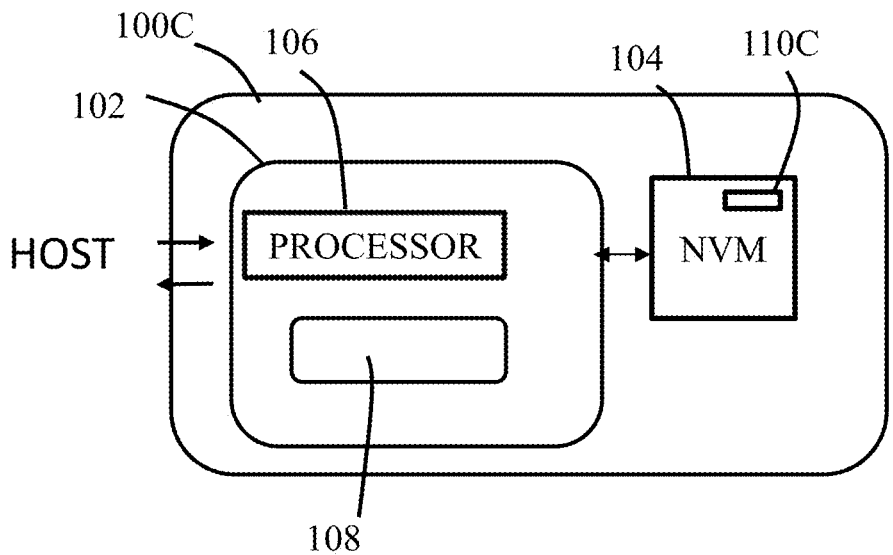
FIG. 1C schematically shows a non-volatile storage system in accordance with yet another embodiment of the present disclosure.

FIG. 1C schematically shows a non-volatile storage system 100C in accordance with yet another embodiment of the present disclosure. In the embodiment shown in FIG. 1C, the system 100C may comprise a temperature sensor 110C on the non-volatile storage device 104. Other than the location of the temperature sensor 110C being different from the location of the temperature sensor 110A, other components of the system 100C may be identical to their respective counterparts of the system 100A. Similar to the temperature sensor 110A, the read-outs from the temperature sensor 110C may be used to obtain the predicted real-time on-die temperature for the non-volatile storage device 104.

It should be noted that although the temperature sensor 100C may be located on the non-volatile storage device 104, the system 100C need not poll the temperature sensor 100C in real-time to obtain the real-time on-die temperature. Because the data bus usage may be limited, regular program and read operations may be given a higher priority over obtaining read-outs from the temperature sensor 110C. Therefore, a previous read-out obtained at a last time stamp may be used to predict the real-time on-die temperature just as using the temperature sensor 110A's read-out in the system 100A. The temperature regression model and factors (e.g., variables in the model) may be built the same way as using the read-outs from the temperature sensor 110A but some coefficients for some variables (e.g., factors) may be different. The voltage regression model and local sweep process may be the same as that of the system 100A.

It should be noted that some embodiments of the non-volatile storage system may have more than one temperature sensor. For example, an embodiment of the non-volatile storage system may comprise any two or all of the temperature sensors 110A, 110B and 110C. In some embodiments that multiple temperature sensors exist in the system, the readouts of each individual temperature senso may be used as a factor in the temperature regression model to predict the real-time on-die temperature of the NAND flash device.

In embodiment of a non-volatile storage system 100C in which the non-volatile storage device 104 contains a temperature sensor 110C, the temperature sensor 110C may be polled periodically to actively adjust the predicted real-time on-die temperature. This may help improve the accuracy of the predicted temperature while minimizing the impact to the storage device data bus and system throughput.

It should be noted that in embodiments, a non-volatile storage system (e.g., 100A, 100B or 100C) may comprise a plurality of non-volatile storage devices 104, a predicted real-time on-die temperature may be obtained for any one of non-volatile storage device 104 separately for reading data stored in the respective non-volatile storage device.

In at least one embodiment, some or all of the processor 106, the storage media 108 and temperature 110A if available may be integrated in one Integrated Circuit (IC) chip.

Figure 2:
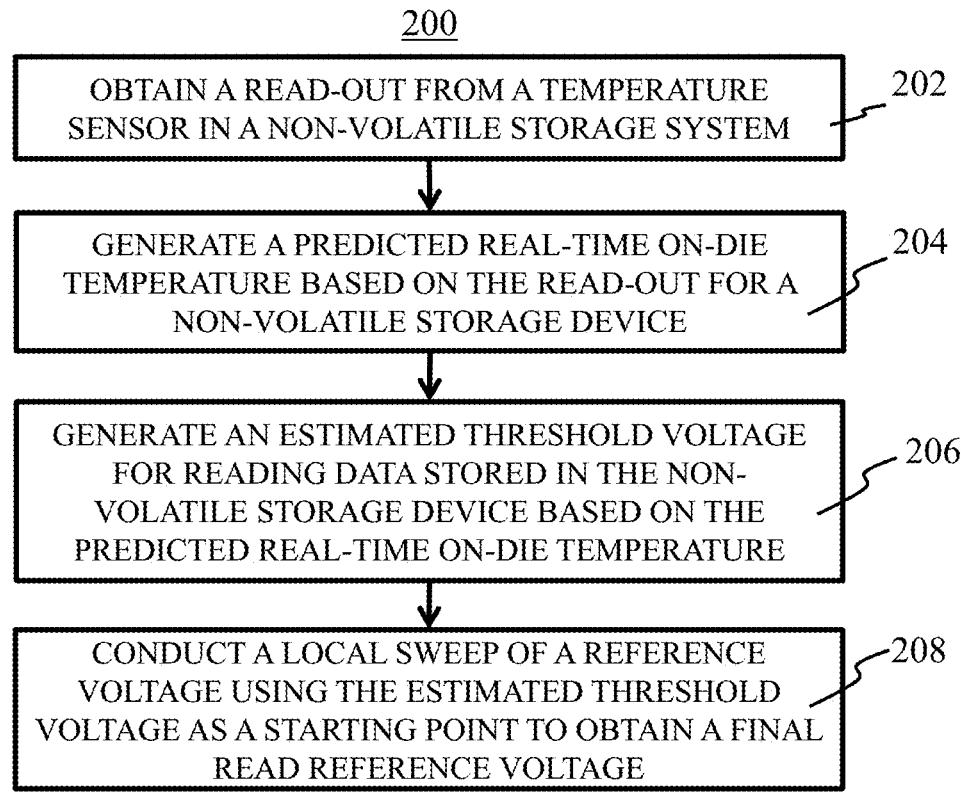
FIG. 2 is a flowchart of a process for temperature assisted non-volatile storage device management in accordance with an embodiment of the present disclosure.

FIG. 2 is a flowchart for a process 200 for obtaining a final reference voltage in a non-volatile storage device in accordance with an embodiment of the present disclosure. In block 202, a read-out from a temperature sensor in a non-volatile storage system may be obtained. For example, the read-out from temperature sensor 110A, 110б, or 110C may be obtained in the non-volatile storage systems 100A, 100B or 100C. In block 204, a predicted real-time on-die temperature may be generated for a non-volatile storage device in the storage system based on the read-out. In various embodiments, the temperature regression model may be used to determine a temperature correction to the read-out with a plurality of factors being considered. In block 206, an estimated threshold voltage may be generated for reading data stored in the non-volatile storage device. In various embodiments, the estimated threshold voltage may be generated based on the predicted real-time on-die temperature. For example, the voltage regression model may be used to generate the estimated threshold voltage based on the predicted real-time on-die temperature with a plurality of factors being considered.

In block 208, a local sweep of a reference voltage may be conducted using the estimated threshold voltage as a starting point to obtain a final read reference voltage with a minimum read bit error rate. In one embodiment, the local sweep of the reference voltage may start by decreasing from the estimated threshold voltage.

The process 200 may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the process 200 may be implemented in hardware circuitry (e.g., FPGA or ASIC). In another embodiment, the process 200 may be implemented in firmware and stored in a read-only memory (e.g., storage 108), and performed by the processor 106 executing the firmware. Moreover, the process 200 may be programmed in computer processor executable instructions, stored in a non-transitory machine-readable medium (e.g., hard drive, CD, DVD, etc.) and performed by a computer processor (e.g., a microprocessor or a microcontroller) executing the executable instructions.

In an exemplary embodiment, there is provided a method that may comprise obtaining a read-out from a temperature sensor in a non-volatile storage system, generating a predicted real-time on-die temperature for a non-volatile storage device in the storage system based on the read-out, generating an estimated threshold voltage for reading data stored in the non-volatile storage device based on the predicted real-time on-die temperature and conducting a local sweep of a reference voltage using the estimated threshold voltage as a starting point to obtain a final read reference voltage with a minimum read bit error rate.

In one embodiment, the temperature sensor may be on a storage controller of the non-volatile storage system, a printed circuit board of the non-volatile storage system or the non-volatile storage device.

In one embodiment, the predicted real-time on-die temperature may be generated by a temperature regression model using the read-out as an input.

In one embodiment, the temperature regression model may be a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

In one embodiment, the estimated threshold voltage may be generated by a voltage regression model using the predicted real-time on-die temperature as an input.

In one embodiment, the voltage regression model may be a multivariable regression model based on a plurality of factors including the predicted real-time on-die temperature, an average dwell time, a data retention time, and a number of P/E cycles.

In one embodiment, the estimated threshold voltage generated by the voltage regression model may decrease with an increase of the data retention time.

In one embodiment, the plurality of factors may include a programming temperature and the estimated threshold voltage generated by the voltage regression model may increase with an increase of the programming temperature.

In another exemplary embodiment, there is provided a non-volatile storage system. The non-volatile storage system may comprise a non-volatile storage device, a temperature sensor and a processor. The processor may be configured to obtain a read-out from the temperature sensor, generate a predicted real-time on-die temperature for the non-volatile storage device based on the read-out, generate an estimated threshold voltage for reading data stored in the non-volatile storage device based on the predicted real-time on-die temperature, and conduct a local sweep of a reference voltage using the estimated threshold voltage as a starting point to obtain a final read reference voltage with a minimum read bit error rate.

In one embodiment, the temperature sensor may be on a storage controller of the non-volatile storage system, a printed circuit board of the non-volatile storage system or the non-volatile storage device.

In one embodiment, the predicted real-time on-die temperature may be generated by a temperature regression model using the read-out as an input, and the temperature regression model may be a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

In one embodiment, the estimated threshold voltage may be generated by a voltage regression model using the predicted real-time on-die temperature as an input, and wherein the voltage regression model may be a multivariable regression model based on a plurality of factors including the predicted real-time on-die temperature, an average dwell time, a data retention time, and a number of P/E cycles.

In one embodiment, the estimated threshold voltage generated by the voltage regression model may decrease with an increase of the data retention time.

In one embodiment, the plurality of factors may include a programming temperature and the estimated threshold voltage generated by the voltage regression model may increase with an increase of the programming temperature.

In yet another exemplary embodiment, there is provided a non-transitory machine-readable medium. The non-transitory machine-readable medium may have computer instructions that when executed by a hardware processor, may cause the hardware processor to perform obtaining a read-out from a temperature sensor in a non-volatile storage system, generating a predicted real-time on-die temperature for a non-volatile storage device in the storage system based on the read-out, generating an estimated threshold voltage for reading data stored in the non-volatile storage device based on the predicted real-time on-die temperature and conducting a local sweep of a reference voltage using the estimated threshold voltage as a starting point to obtain a final read reference voltage with a minimum read bit error rate.

In one embodiment, the temperature sensor may be on a storage controller of the non-volatile storage system, a printed circuit board of the non-volatile storage system or the non-volatile storage device.

In one embodiment, the predicted real-time on-die temperature may be generated by a temperature regression model using the read-out as an input, and the temperature regression model may be a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

In one embodiment, the estimated threshold voltage may be generated by a voltage regression model using the predicted real-time on-die temperature as an input, and wherein the voltage regression model may be a multivariable regression model based on a plurality of factors including the predicted real-time on-die temperature, an average dwell time, a data retention time, and a number of P/E cycles.

In one embodiment, the estimated threshold voltage generated by the voltage regression model may decrease with an increase of the data retention time.

In one embodiment, the plurality of factors may include a programming temperature and the estimated threshold voltage generated by the voltage regression model may increase with an increase of the programming temperature.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   obtaining a read-out from a temperature sensor in a non-volatile storage system;
   generating a predicted real-time on-die temperature for a non-volatile storage device in the storage system based on the read-out;
   generating an estimated threshold voltage for reading data stored in the non-volatile storage device based on the predicted real-time on-die temperature; and
   conducting a local sweep of a reference voltage using the estimated threshold voltage as a starting point to obtain a final read reference voltage with a minimum read bit error rate.

2. The method of claim 1, wherein the temperature sensor is on a storage controller of the non-volatile storage system, a printed circuit board of the non-volatile storage system or the non-volatile storage device.

3. The method of claim 1, wherein the predicted real-time on-die temperature is generated by a temperature regression model using the read-out as an input.

4. The method of claim 3, wherein the temperature regression model is a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

5. The method of claim 1, wherein the estimated threshold voltage is generated by a voltage regression model using the predicted real-time on-die temperature as an input.

6. The method of claim 5, wherein the voltage regression model is a multivariable regression model based on a plurality of factors including the predicted real-time on-die temperature, an average dwell time, a data retention time, and a number of P/E cycles.

7. The method of claim 6, wherein the estimated threshold voltage generated by the voltage regression model decreases with an increase of the data retention time.

8. The method of claim 6, wherein the plurality of factors include a programming temperature and the estimated threshold voltage generated by the voltage regression model increases with an increase of the programming temperature.

9. A non-volatile storage system, comprising:
   a non-volatile storage device;
   a temperature sensor; and
   a processor configured to:
      obtain a read-out from the temperature sensor;
      generate a predicted real-time on-die temperature for the non-volatile storage device based on the read-out;
      generate an estimated threshold voltage for reading data stored in the non-volatile storage device based on the predicted real-time on-die temperature; and
      conduct a local sweep of a reference voltage using the estimated threshold voltage as a starting point to obtain a final read reference voltage with a minimum read bit error rate.

10. The non-volatile storage system of claim 9, wherein the temperature sensor is on a storage controller of the non-volatile storage system, a printed circuit board of the non-volatile storage system or the non-volatile storage device.

11. The non-volatile storage system of claim 9, wherein the predicted real-time on-die temperature is generated by a temperature regression model using the read-out as an input, and the temperature regression model is a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

12. The non-volatile storage system of claim 9, wherein the estimated threshold voltage is generated by a voltage regression model using the predicted real-time on-die temperature as an input, and wherein the voltage regression model is a multivariable regression model based on a plurality of factors including the predicted real-time on-die temperature, an average dwell time, a data retention time, and a number of P/E cycles.

13. The non-volatile storage system of claim 12, wherein the estimated threshold voltage generated by the voltage regression model decreases with an increase of the data retention time.

14. The non-volatile storage system of claim 12, wherein the plurality of factors include a programming temperature and the estimated threshold voltage generated by the voltage regression model increases with an increase of the programming temperature.

15. A non-transitory machine-readable medium having computer instructions, wherein the computer instructions, when executed by a hardware processor, cause the hardware processor to perform:
- obtaining a read-out from a temperature sensor in a non-volatile storage system;
- generating a predicted real-time on-die temperature for a non-volatile storage device in the storage system based on the read-out;
- generating an estimated threshold voltage for reading data stored in the non-volatile storage device based on the predicted real-time on-die temperature; and
- conducting a local sweep of a reference voltage using the estimated threshold voltage as a starting point to obtain a final read reference voltage with a minimum read bit error rate.

16. The non-transitory machine-readable medium of claim 15, wherein the temperature sensor is on a storage controller of the non-volatile storage system, a printed circuit board of the non-volatile storage system or the non-volatile storage device.

17. The non-transitory machine-readable medium of claim 15, wherein the predicted real-time on-die temperature is generated by a temperature regression model using the read-out as an input, and the temperature regression model is a multivariable regression model based on a plurality of factors including the read-out, a physical distance between the temperature sensor and the non-volatile storage device, thermal properties of heat conducting materials in the non-volatile storage system, and access frequencies and read/write access intensity for the non-volatile storage device.

18. The non-transitory machine-readable medium of claim 15, wherein the estimated threshold voltage is generated by a voltage regression model using the predicted real-time on-die temperature as an input, and wherein the voltage regression model is a multivariable regression model based on a plurality of factors including the predicted real-time on-die temperature, an average dwell time, a data retention time, and a number of P/E cycles.

19. The non-transitory machine-readable medium of claim 18, wherein the estimated threshold voltage generated by the voltage regression model decreases with an increase of the data retention time.

20. The non-transitory machine-readable medium of claim 18, wherein the plurality of factors include a programming temperature and the estimated threshold voltage generated by the voltage regression model increases with an increase of the programming temperature.

* * * * *